(12) United States Patent
Dengi et al.

(10) Patent No.: US 7,356,784 B1
(45) Date of Patent: Apr. 8, 2008

(54) INTEGRATED SYNTHESIS PLACEMENT AND ROUTING FOR INTEGRATED CIRCUITS

(75) Inventors: Enis Aykut Dengi, Tempe, AZ (US); Stephen McCracken, Tempe, AZ (US); Michael R. Kelly, Gibsonia, PA (US); Matthew B. Phelps, Pittsburgh, PA (US); Ibraz Mohammed, Tempe, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 311 days.

(21) Appl. No.: 11/006,323

(22) Filed: Dec. 6, 2004

Related U.S. Application Data

(60) Provisional application No. 60/527,431, filed on Dec. 5, 2003.

(51) Int. Cl.
*G06F 17/50* (2006.01)

(52) U.S. Cl. .................. 716/2; 716/4; 716/7; 716/10; 716/13

(58) Field of Classification Search .............. 716/2, 716/4, 7, 10, 13
See application file for complete search history.

(56) References Cited

U.S. PATENT DOCUMENTS

| | | | |
|---|---|---|---|
| 4,554,625 A | 11/1985 | Otten | |
| 5,764,531 A | 6/1998 | Kojima et al. | |
| 5,926,397 A | 7/1999 | Yamanouchi | |
| 5,987,086 A * | 11/1999 | Raman et al. | 716/1 |
| 6,009,248 A * | 12/1999 | Sato et al. | 716/2 |
| 6,011,911 A | 1/2000 | Ho et al. | |
| 6,066,180 A | 5/2000 | Kim et al. | |
| 6,161,078 A | 12/2000 | Ganley | |
| 6,230,304 B1 | 5/2001 | Groeneveld et al. | |
| 6,282,693 B1 * | 8/2001 | Naylor et al. | 716/8 |
| 6,282,694 B1 | 8/2001 | Cheng et al. | |
| 6,292,929 B2 * | 9/2001 | Scepanovic et al. | 716/14 |
| 6,301,693 B1 * | 10/2001 | Naylor et al. | 716/10 |
| 6,367,052 B1 | 4/2002 | Steinberg et al. | |
| 6,389,582 B1 | 5/2002 | Valainis et al. | |
| 6,397,169 B1 * | 5/2002 | Shenoy et al. | 703/14 |
| 6,425,110 B1 | 7/2002 | Hathaway et al. | |
| 6,480,997 B1 * | 11/2002 | Tanaka | 716/12 |
| 6,550,046 B1 | 4/2003 | Balasa et al. | |
| 6,601,226 B1 * | 7/2003 | Hill et al. | 716/10 |
| 6,662,348 B1 * | 12/2003 | Naylor et al. | 716/9 |

(Continued)

OTHER PUBLICATIONS

NN86044981, "Timing-Influenced Layout Design", IBM Technical Disclosure Bulletin, vol. 28, No. 11, Apr. 1986, pp. 4981-4987 (9 pages).*

(Continued)

*Primary Examiner*—Phallaka Kik
(74) *Attorney, Agent, or Firm*—Novak Druce & Quigg LLP; Robert E. Scheid

(57) ABSTRACT

A method determining an IC (integrated circuit) design includes: determining one or more design variables, wherein the one or more design variables include one or more device variables and one or more weights; determining one or more net lengths and one or more layout metrics from the one or more device variables and the one or more weights; and determining the IC design from the one or more device variables and the one or more net lengths. The IC design includes a schematic and a layout. The process can be repeated as needed according to performance criteria that may include circuit performance metrics and layout performance metrics.

22 Claims, 14 Drawing Sheets

U.S. PATENT DOCUMENTS

| | | | |
|---|---|---|---|
| 6,671,859 B1* | 12/2003 | Naylor et al. | 716/2 |
| 6,678,644 B1 | 1/2004 | Segal | |
| 6,775,808 B1* | 8/2004 | Raje et al. | 716/4 |
| 6,951,003 B2* | 9/2005 | Barbee et al. | 716/10 |
| 7,089,523 B2* | 8/2006 | Teig et al. | 716/12 |
| 7,178,118 B2* | 2/2007 | Ramachandran et al. | 716/5 |
| 7,216,308 B2* | 5/2007 | Teig et al. | 716/2 |
| 7,257,800 B1* | 8/2007 | Singh et al. | 716/16 |
| 2002/0184603 A1 | 12/2002 | Hassibi et al. | |
| 2003/0009728 A1* | 1/2003 | Marple | 716/2 |
| 2004/0044977 A1* | 3/2004 | Gore et al. | 716/7 |
| 2004/0098680 A1* | 5/2004 | Teig et al. | 716/4 |
| 2004/0230931 A1* | 11/2004 | Barbee et al. | 716/10 |
| 2004/0243953 A1* | 12/2004 | Ramachandran et al. | 716/5 |
| 2004/0243964 A1* | 12/2004 | McElvain et al. | 716/12 |
| 2005/0050508 A1* | 3/2005 | Gore et al. | 716/12 |
| 2005/0086626 A1* | 4/2005 | Sato et al. | 716/11 |
| 2006/0010412 A1* | 1/2006 | Teig et al. | 716/8 |
| 2006/0206848 A1* | 9/2006 | Teig et al. | 716/10 |
| 2007/0089074 A1* | 4/2007 | Ramachandran et al. | 716/2 |

OTHER PUBLICATIONS

NN8805300, "Optimum Routing of Critical Circuit Timing Paths", IBM Technical Disclosure Bulletin, vol. 30, No. 12, May 1988, pp. 300-302 (5 pages).*

NN8901208, "Weighted Length Minimization Algorithm for Printed Circuit Wiring", IBM Technical Disclosure Bulletin, vol. 31, No. 8, Jan. 1989, pp. 208-211 (5 pages).*

Windschiegl et al., "A Wire Load Model for More Accurate Power Distribution Estimation", The 2002 45th Midwest Symposium on Circuits and Systems, vol. 1, Aug. 4, 2002, pp. I-376-379.*

Arsintescu, B. et al. (1998) "Constraints Space Management For the Layout of Analog IC's," *Design Automation and Test in Europe*, pp. 971-972.

Baez-Lopez, D. et al. (1993) "Conversion Of Circuit Schematics From A Graphic Display To A Netlist And Its Applications." *Proceedings of the 36th Midwest Symposium on Circuits and Systems*, Detroit, MI, Aug. 16-18, 1993, 2:1159-1161.

Balasa, F. et al. (2001) "Device-Level Placement For Analog Layout: An Opportunity For Non-Slicing Topological Representations," *Proc. Asia and South-Pacific Design Automation Conf. (ASP-DAC)*, Yokohama, Japan, Jan.-Feb. 2001, pp. 281-286.

Balasa, F. et al. (Jul. 2000) "Module Placement for Analog Layout Using The Sequence-Pair Representation," *Proc. of the 36th ACM/IEEE Design Automation Conf. (DAC)*, New Orleans LA, Jun. 1999, pp. 274-279.

Balasa, F. et al. (Jul. 2000) "Symmetry Within The Sequence-Pair Representation In The Context Of Placement For Analog Design," *IEEE Transactions On Computer-Aided Design Of Integrated Circuits and Systems*, 19(7):721-731.

Brandolese, M. et al. (1996) "Analog Circuits Placement: A Constraint Driven Methodology," *IEEE International Symposium on Circuits and Systems 1996*, ISCAS, Atlanta, Georgia, pp. 635-638.

Charbon E. et al. (May 1992) "A Constraint-Driven Placement Methodology For Analog Integrated Circuits," *IEEE 1992 Custom Integrated Circuits Conference*, Boston, MA, May 3-6, 1992, pp. 2821-2824.

Charbone E. et al. (May 1994) "Imposing Tight Specifications on Analog IC's Through Simultaneous Placement And Module Optimization," *IEEE 1994 Custom Integrated Circuits Conference*, San Diego, CA, May 1-4, 1994, pp. 525-528.

Charbone E. et al. (May 1995) "A Performance-Driven Router for RF and Microwave Analog Circuit Design," *IEEE 1995 Custom Integrated Circuits Conference*, Santa Clara, CA, May 1-4, 1995 pp. 383-386.

Choudhury, U. et al. (Feb. 1993) "Automatic Generation Of Parasitic Constraints For Performance-Driven Physical Design Of Analog Circuits." *IEEE Trans. on Comp. Aided Design*, 12(2):208-224.

Choudhury, U. et al. (Jun. 1990) "Constraint Generation for Routing Analog Circuits," *27th ACM/IEEE Design Automation Conference*, Orlando, FL, Jun. 24-28, 1990, pp. 561-566.

Cohn, J.M. (Mar. 1991) "KOAN/ANAGRAM II: New Tools For Device-Level Analog Placement and Routing," *IEEE Journal Of Solid-State Circuits*, 26(3):330-342.

Degrauwe, M.G.R. et al. (Dec. 1987) "IDAC: An Interactive Design Tool For Analog CMOS Circuits," *IEEE Journal of Solid State Circuits*, Sc22(6):1106-1166.

Felt, E. et al. (1992) "An Efficient Methodology For Symbolic Compaction Of Analog IC's With Multiple Symmetry Constrains," *Proc. European Design Automation Conference*, Hamburg, Germany, pp. 148-153.

Felt, E. et al. (1993) "Performance-Driven Compaction for Analog Integrated Circuits," *Proc. IEEE 1993 Custom Integrated Circuits Conference*, San Diego, CA, May 9-12, 1993, pp. 17.3.1-17.3.5.

Ganley, J. (1999) "Efficient Solution of Systems Of Orientation Constraints," In *Proc. 1999 International Symposium On Physical Design*, Monterrey, CA, Apr. 12-14, 1999, pp. 140-144.

Gielen, G.G.E et al. (Dec. 2000) "A Computer Aided Design of Analog and Mixed Signal Integrated Circuits," *Proceedings of the IEEE*, 88(12):1825-1852.

Guo, P.N. et al. (Jun. 1999) "An O-Tree Representation Of Non-Slicing Floorplan and Its Application," *Proc. ACM/IEEE Design Automation Conference*, New Orleans, LA, Jun. 21-25, 1999, pp. 268-273.

Harjani, R. et al. (Dec. 1989) "OASYS: A Framework for Analog Circuit Synthesis," *IEEE Transactions on Computer Aided Design*, 8(12):1247-1266.

Jepsen, D.W. et al. (Nov. 1984) "Macro Placement By Monte Carlo Annealing," *Proc. IEEE International Conference on Computer Design*, pp. 495-498.

Kirkpatrick, S. et al. (1983) "Optimization By Simulated Annealing." *Science*, 220(4598):671-680.

Kleinhans, J.M. (Mar. 1991) "GORDIAN: VLSI Placement By Quadratic Programming And Slicing Optimization," *IEEE Transactions On Computer-Aided Design*, 10(3):356-365.

Koh, H.Y. et al. (Feb. 1990) "OPASYN: A Compiler for CMOS Operational Amplifiers," *IEEE Transactions on Computer Aided Design*, 9(2):113-125.

Krasnicki, M. et al. (1999) "Maelstrom: Efficient Simulation-Based Synthesis For Customer Analog Cells." *Proc. ACM/IEEE Design Automation Conference*, New Owleans, Louisiana, Jun. 21-25, 1999, pp. 945-950.

Lampaert, K. et al. (1995) "Direct Performance-Driven Placement of Mismatch-sensitive Analog Circuits," *32nd ACM/IEEE Design Automation Conference*, San Francisco, CA, Jun. 12-16, 1995, pp. 445-449.

Liu, E.C. et al. (2001) "Slicing Floorplan Design With Boundary—Constrained Modules" *Proceedings of the 2001 International Symposium in Physical Design*, Sonoma, CA, Apr. 1-4, 2001, pp. 124-129.

Malavasi, E. et al (Aug. 1993) "Area Routing For Analog Layout," *IEEE Transactions On Computer Aided Design of Integrated Circuits and Systems*, 12(8):1186-1197.

Malavasi, E. et al. (1995) "Dynamic Bound Generation For Constraint-Driven Routing," *IEEE 1995 Custom Integrated Circuits Conference*, Santa Clara, CA, May 1-4, 1995, pp. 477-480.

Malavasi, E. et al. (1997) "Quick Placement With Geometric Constraints," *IEEE 1997 Custom Integrated Circuits Conference*, May 5-8, 1997, Santa Clara, CA, pp. 561-564.

Malavisi, E. (1991) "Virtual Symmetry Axes for the Layout of Analog IC's," *Proc. $2^{nd}$ ICVC*, Seoul, Korea, Oct. 1991, pp. 1-10.

Maruvada et al. (2003) "Placement with symmetry constraints for analog layout using red-black trees," *2003 International Symposium on Circuits and Systems*, May 25-28, 2003, 5:V489-V492.

Mitra, S. et al. (Mar. 1995) "Substrate-Aware Mixed-Signal Macro-Cell Placement in WRIGHT," *IEEE Journal of Solid-State Circuits*, 30(3):269-278.

Mitra, S. et al. (1992) "System-Level Routing of Mixed-Signal ASIC's In Wren," *Proc. IEEE International Conference on Computer-Aided Design*, Santa Clara, CA, Nov. 8-12, 1992, pp. 394-399.

Murata, H. et al. (Dec. 1996) "VLSI Module Placement Based on Rectangle-Packing By the Sequence-Pair," *IEEE Transactions on Computer-Aided Design of Integrated Circuits and Systems*, 15(12):1518-1524.

Nagel, L. et al. (Aug. 1971) "Computer Analysis Of Nonlinear Circuits, Excluding Radiation (CANCER)." *IEEE Journal of Solid-State Circuits*, 6(4):166-182.

Veverka, Tanya M., "Chapter 1: Introduction to NeoCircuit," in *NeoCircuit User's Guide: Version 1.2*, Neolinear, Inc. Pittsburgh, PA, pp. toc, 1-4.

Veverka, Tanya M., "Chapter 1: Introduction to NeoCell," in *NeoCell User's Guide: Version 3.1*, Neolinear, Inc., Puittsburgh, PA, pp. toc, 1-6.

NN8712251, (Dec. 1, 1987) "Method for Improving Geometric Packaging of Circuit Chip Modules: Utilizing Top-Down Slicing-Based Floorplanning," *IBM Technical Disclosure Bulletin*, 30(7):251-253.

Ochotta, E. et al. (1994) "Analog Circuit Synthesis For Large, Realistic Cells: Designing a Pipelined A/D Converter with ASTRX/OBLX," *Proc., IEEE Custom Integrated Circuit Conference*, San Diego, CA, May 1-4, 1994, pp. 365-368.

Okuda, R. et al. (1989) "An Efficient Algorithm for Layout Compaction Problem With Symmetry Constraints," *Proc. IBBB ICCAD*, Santa Clara, CA, Nov. 5-9, 1989, pp. 148-151.

Pang, Y. et al. (2000) "Block Placement Symmetry Constraints Based on the O-Tree Non-Slicing Representation," *Proc. ACM/IEEE Design Automation Conference*, Los Angeles, CA, Jun. 5-9, 2000, pp. 464-467.

Phelps, R. et al. (1999) "ANACONDA: Robust Synthesis Of Analog Circuits Via Stochastic Pattern Search," *IEEE Custom Integrated Circuits Conference*, San Diego, CA, May 16-19, 1999.

Phelps, R. et al. (2000) "A Case Study of Synthesis for Industrial-Scale Analog IP: Redesign of the Equalizer/Filter Frontend for an ÀDSL Codec," *37th ACM/IEEE Design Automation Conference*, Los Angeles, CA, Jun. 5-9, 2000, pp. 1-6.

Pillan, M. et al. (1994) "Constraint Generation and Placement for Automatic Layout Design of Analog Integrated Circuits," *Proc. IEEE International Symposium on Circuits and Systems*, 1:355-358.

Prieto J.A. et al. (1997) "A performance-driven placement algorithm with simultaneous Place&Route optimization for analog IC's," *European Design and Test Conference*, Mar. 17-20, 1997, pp. 389-394.

Prieto, J.A. et al. (1994) "An Algorithm For the Place-And-Route Problem In the Layout of Analog Circuits," *Proc. IEEE ISCAS*, London, UK, May 30-Jun. 2, 1994, pp. 491-494.

Rijmenants, J. et al. (Apr. 1989) "ILAC: An Automated Layout Tool for Analog CMOS Circuits," *IEEE Journal of Solid State Circuits*, 24(2):417-425.

Vancorenland, P. et al. (2001) "A Layout-Aware Synthesis Methodology for RF Circuits," *2001 International Conference on Computer Aided Design*, San Jose, CA, Nov. 4-8, 2001, pp. 358-362.

Wong, D.F. et al. (1986) "A New Algorithm For Floorplan Design," *23hu rd ACM/IEEE Design Automation Conference*, Las Vegas, NV, Jul. 1986, pp. 101-107.

Zhang, G. et al. (2002) "Automatic Synthesis of a 2.1 GHz SiGe Low Noise Amplifier," *IEEE RFIC Symposium*, Seattle, WA, Jun. 2-4, 2002, pp. 1-4.

\* cited by examiner

End-to-end Example: Low Noise Amplifier (cont.)

Complete list of design variables

| Design Variable | Range |
|---|---|
| w1 | [1u:1u:5u] |
| l1 | [1u:1u:5u] |
| c1 | [1p:1p:5p] |
| ind1 | [1n:1n:5n] |
| ind2 | [1n:1n:5n] |
| ind3 | [1n:1n:5n] |
| Netweight_in | [0:0.1:1] |
| Netweight_in1 | [0:0.1:1] |
| Netweight_b | [0:0.1:1] |
| Netweight_c | [0:0.1:1] |
| Netweight_e | [0:0.1:1] |
| Netweight_out | [0:0.1:1] |
| Netweight_VDD | [0:0.1:1] |
| Netweight_GND | [0:0.1:1] |

Rows w1–ind3: Device variables (1110)
Rows Netweight_in–Netweight_GND: Net weights (1112)

FIG. 11B

End-to-end Example: Low Noise Amplifier (cont.)

1114
Final layout from floorplanning tool

End-to-end Example: Low Noise Amplifier (cont.)

1116
Progress of the integrated sizing and floorplanning module, operating on the LNA

| Design Variable | Iteration/design point # | | | |
|---|---|---|---|---|
| | 1 | 2 | 3 | 4 |
| w1 | 3u | 3u | 3u | 2u |
| l1 | 1u | 1u | 2u | 2u |
| c1 | 2p | 5p | 5p | 1p |
| ind1 | 1n | 1n | 1n | 3n |
| ind2 | 2n | 3n | 3n | 1n |
| ind3 | 1n | 2n | 2n | 1n |
| Netweight_in | 0.5 | 0.5 | 0.5 | 0.5 |
| Netweight_in1 | 0.5 | 0.8 | 0.5 | 0.1 |
| Netweight_b | 0.5 | 0.5 | 0.5 | 0.5 |
| Netweight_c | 0.5 | 0.3 | 0.5 | 0.1 |
| Netweight_e | 0.5 | 0.5 | 0.5 | 0.5 |
| Netweight_out | 0.5 | 0.5 | 1.0 | 0.5 |
| Netweight_VDD | 0.5 | 0.5 | 0.5 | 0.1 |
| Netweight_GND | 0.5 | 0.5 | 0.5 | 0.5 |
| Performance | | | | |
| Gain | 12dB | 25dB | 23dB | 15dB |
| NF | 5dB | 1.5dB | 1.4dB | 1.3dB |
| IIP3 | 12dBm | -5dBm | 0dBm | 12dBm |
| AREA | 700um$^2$ | 650um$^2$ | 1000um$^2$ | 700um$^2$ |

FIG. 11D

INTEGRATED SYNTHESIS PLACEMENT AND ROUTING FOR INTEGRATED CIRCUITS

CROSS-REFERENCE TO RELATED APPLICATIONS

This application claims the benefit of provisional application 60/527,431, filed Dec. 5, 2003, and incorporated herein by reference in its entirety.

STATEMENT REGARDING FEDERALLY SPONSORED RESEARCH OR DEVELOPMENT

This invention was made with government support under grant number TIA F33615-01-2-1970 awarded by the Defense Advanced Research Projects Agency (DARPA). The government has certain rights in the invention.

BACKGROUND OF THE INVENTION

1. Field of Invention

The present invention relates to the design of ICs (integrated circuits) generally and more particularly to the design of analog and RF (radio frequency) ICs.

2. Description of Related Art

Stringent performance requirements combined with internal sensitivities have created challenges for conventional IC design and especially for analog and RF designs. For example, RF designs are relatively sensitive to interconnect parasitics, and as a result the capacitance, inductance and resistance of wires between devices can have a significant impact on the electrical performance of an RF circuit. Similar challenges are found in the context of analog IC design.

A regular circuit schematic consists of devices (e.g., resistors, capacitors, transistors). When such a schematic is simulated, the impact of interconnect parasitics is typically not taken into account. In a typical IC design flow, this impact is only known at the very end of the design cycle when the layout is complete and the interconnect parasitics are extracted via layout parasitic extraction (LPE). The extracted netlist is then simulated. For RF designs, oftentimes, the design fails to meet the targeted specifications when the deleterious effects of interconnect are accounted for. A typical RF IC design process might require at least six passes through schematic sizing, layout and LPE. This reduces productivity and lengthens time to market.

FIG. 1 shows a conventional manual method 100 for IC design. First a schematic sizing 102 is carried out. Then simulations 104 are carried out in order to test 106 whether the preliminary performance specifications have been met. If not, then the schematic sizing 102 is repeated followed by simulation 104 until the preliminary performance test 106 is passed. In practice this stage may require twenty or more iterations.

Next a layout is generated 108 followed by estimation of layout parasitics 110 and simulation 112 in order to test 114 whether the final performance specifications are satisfied. If not, the process is restarted with the generation 108 of another layout (or the schematic sizing 102) until the final performance test 114 is passed. In practice this stage may require six or more iterations. After the final test 114 is passed, a tape-out 116 can be done.

Variations in these process steps are also known, for example, for automating at least some of the process steps. A conventional automated method 118 for IC design combines schematic sizing 102, simulation 104 and a preliminary performance test 106 into an automated sizing process 120, which again might require twenty or more internal iterations for convergence. An automated layout step 122 is then followed by layout parasitic extraction 124, simulation 126 and a final performance test 128 before a tape-out 130. Similarly as in the other method 100, six or more iterations may be required to meet the final performance test 128.

As discussed above, this design process can be cumbersome in important contexts with stringent performance requirements and internal sensitivities (e.g., for analog ICs and RF ICs). There have been attempts at constraining the layout so that the parasitics introduced do not exceed pre-computed limits that are set to ensure that the circuit continues to meet performance specifications after layout. (U. Choudhury, A. Sangiovanni-Vincentelli, "Automatic Generation of Parasitic Constraints for Performance-Driven Physical Design of Analog Circuits", *IEEE Trans. on Comp. Aided Design*, vol. CAD-12, n. 2, pp. 208-224, February 1993.) In general, however, these solutions have remained academic exercises and have failed to materialize as practical solutions because the constraints thus generated are not realizable in layout.

Thus, there is a need for IC design methods that consider the impact of parasitics at the time of sizing by simultaneously creating a layout as part of an integrated process.

SUMMARY OF THE INVENTION

According to one embodiment of the present invention, a method determining an IC (integrated circuit) design includes: determining one or more design variables, wherein the one or more design variables include one or more device variables and one or more weights; determining one or more net lengths and one or more layout metrics from the one or more device variables and the one or more weights; and determining the IC design from the one or more device variables and the one or more net lengths. The IC design includes a schematic and a layout.

The process can be repeated as needed according to performance criteria that may include circuit performance metrics and layout performance metrics.

According to another embodiment of the present invention, an apparatus for integrated sizing and floorplanning includes a sizing tool for determining one or more design variables and a floorplanning tool for determining one or more net lengths and one or more layout metrics from the one or more device variables and the one or more weights. The floorplanning tool is connected to the sizing tool. The one or more design variables include one or more device variables and one or more weights. The sizing tool determines the IC design from the one or more device variables and the one or more net lengths, where the IC design includes a schematic and a layout.

Additional embodiments include, for example, a computer readable medium storing instructions that carry out the above-described methods. In this way the present invention enables improved IC design by simultaneously creating a layout as part of an integrated process.

BRIEF DESCRIPTION OF THE DRAWINGS

FIGS. 11A, 11B, 11C, and 11D show an embodiment of the present invention.

DETAILED DESCRIPTION OF EXEMPLARY EMBODIMENTS

Figure 1:
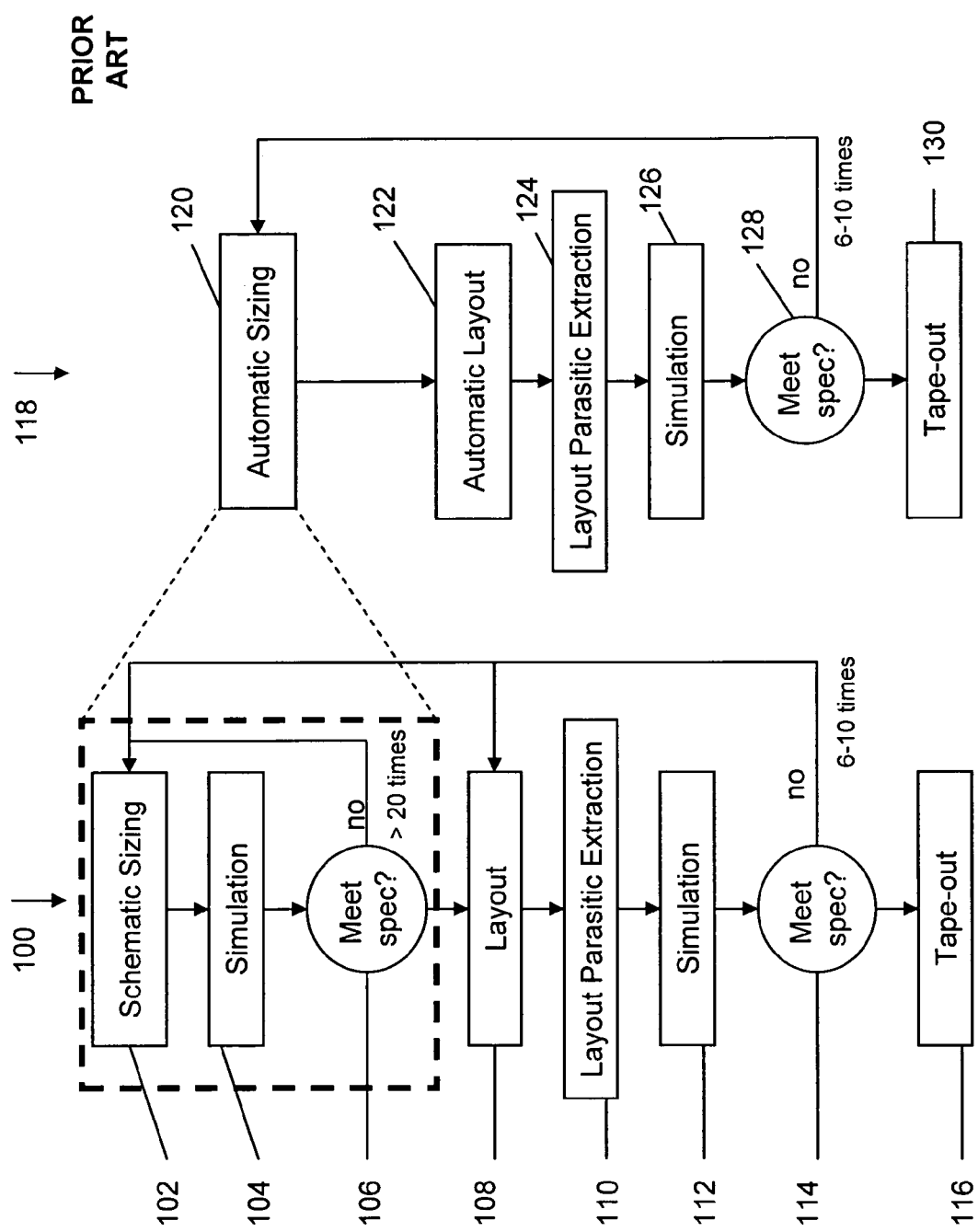
FIG. 1 shows conventional methods for IC design.
Figure 2:
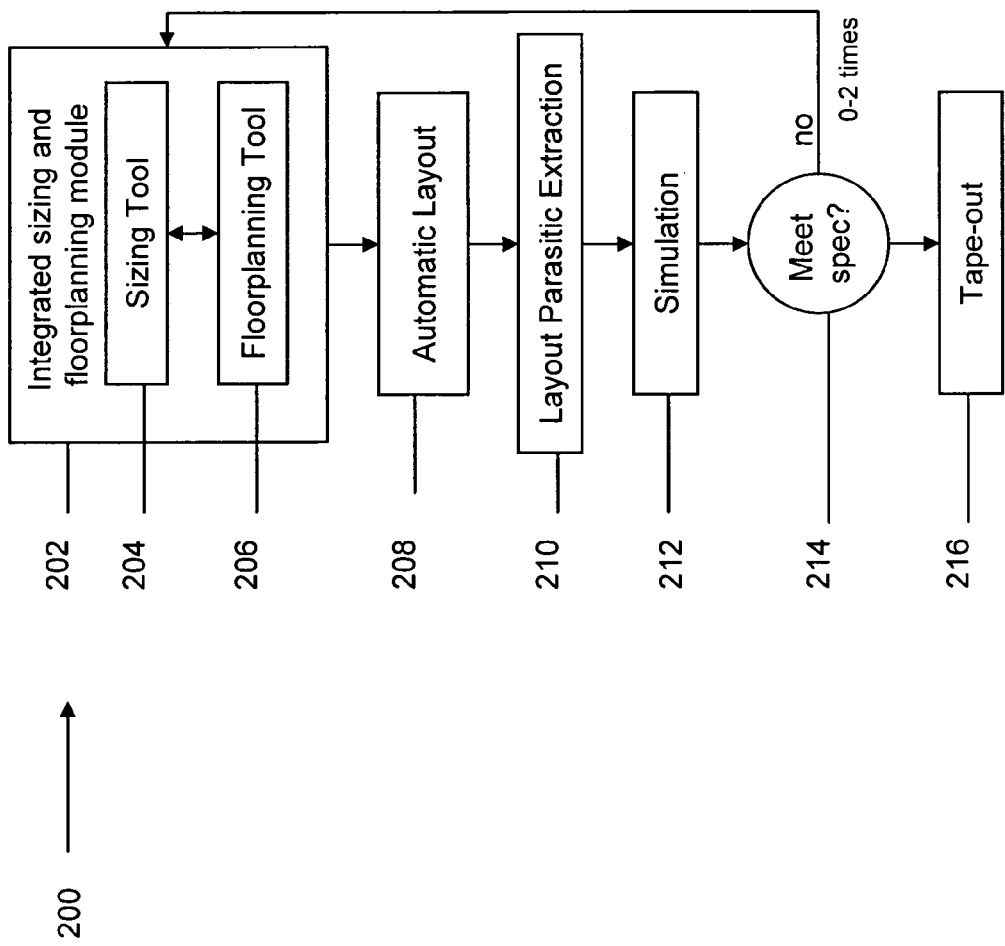
FIG. 2 shows an embodiment of the present invention.

An embodiment of the present invention is shown in FIG. 2. A method 200 for IC design includes an integrated sizing and floorplanning module 202 that includes a sizing tool 204 and a floorplanning tool 206. The module 202 produces a preliminary design including a sized schematic and a preliminary layout. The sized schematic includes specifications for the device parameters and may incorporate information from a previously available unsized schematic (i.e., a schematic with undetermined device parameters). The preliminary layout can be a rough floorplan that includes, for example, translational and rotational coordinates for devices and estimated corresponding net lengths. The preliminary layout can also include addition information (e.g., "guides" for a subsequent more detailed routing, device parameter values that relate to the size and shape of devices, etc.). In some contexts, the sized schematic may be referred to more concisely as a schematic, and the preliminary layout may be referred to more concisely as a layout.

A more detailed layout is then determined by an automated layout tool 208. Then, after layout parasitic extraction 210, simulations 211 are carried out to determine a final test 214 for meeting the performance specifications. If the test 214 is not satisfied, then the process repeats starting with the integrated sizing and floorplanning module 202. After the final test 214 is passed, a tape-out 216 can be done. In contrast to the above-described conventional methods 100, 118, which may require six or more iterations before passing the final performance test 114, 128, this method 300 according to the present invention may converge in one or two iterations. The method 200 can be applied to IC design generally but is particularly desirable in the contexts of analog IC design and RF IC design.

Elements of the method 200 are described in greater detail elsewhere. The sizing tool 204 can use well-known methods for automatic circuit sizing. (R. Phelps, M. Krasnicki, R. A. Rutenbar, L. R. Carley, J. R. Hellums, "ANACONDA: Robust Synthesis of Analog Circuits Via Stochastic Pattern Search," *Proc. IEEE Custom Integrated Circuits Conference*, May 1999.) The floorplanning tool 206 can also be implemented in a variety of ways. For example, the floorplanning tool 206 can use methods for automatic placement as disclosed in nonprovisional application Ser. No. 10/674,085, filed Sep. 29, 2003, and incorporated herein by reference in its entirety. Alternatively, the floorplanning tool 206 can use methods for automatic simultaneous placement and routing as disclosed in nonprovisional application Ser. No. 10/618,237, filed Jul. 11, 2003, and incorporated herein by reference in its entirety.

As discussed above, the preliminary layout (or "floorplanning") produced by the module 202 does not need to be a detailed layout so that it is typically sufficient to use automatic placement without simultaneous routing in the floorplanning tool 206. The floorplanning placement can be rough in the sense that it is not as compact as possible and that not all detailed design rules have been checked. For example, bounding boxes and pins of devices (i.e., "abstracts") can be used for the placement, and then in order to measure net lengths either pre-routing estimates or routing guides can be used instead of a detailed routing. By contrast, the subsequent layout generation 208 does typically employ a more detailed layout with routing so that accurate layout parasitics 210 can be generated.

Figure 3:
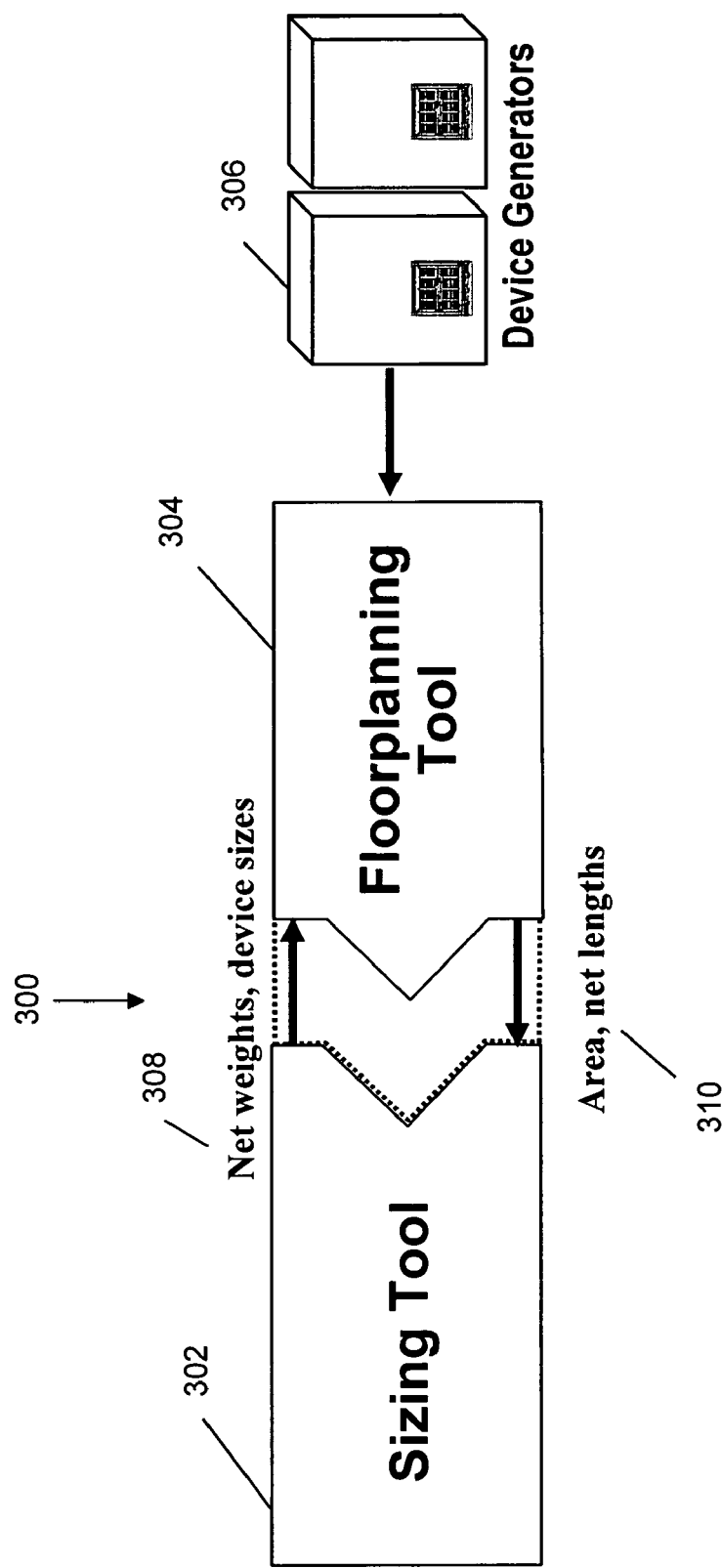
FIG. 3 shows further detail of the embodiment shown in FIG. 2.

FIG. 3 shows further detail of an integrated sizing and floorplanning module 300 that can be used as the module 202 in FIG. 2. The module 300 includes a sizing tool 302 and a floorplanning tool 304. Although not shown in FIG. 3, the sizing tool 302 may receive user inputs such as device constraints (e.g., transistor widths/length ranges) and performance goals (e.g., maximize gain), and the floorplanning tool 304 may receive user inputs such as placement constraints (e.g., symmetry, grouping, proximity) and layout metric goals (e.g., minimize area). The floorplanning tool 304 gets device geometry information (e.g., parameterized by device sizes) from one or more device generators 306. According to the dynamic shown in FIG. 3, the sizing tool 302 passes values for net weights and device sizes 308 to the floor planning tool 304 where a rough layout is determined. Then the floorplanning tool 304 passes values for areas and net lengths 310 to the sizing tool 302. The sizing tool 302 then evaluates the circuit performance, including interconnect parasitic effects of the net lengths 310, and the process can be repeated as necessary till the performance goals are met.

Figure 4:
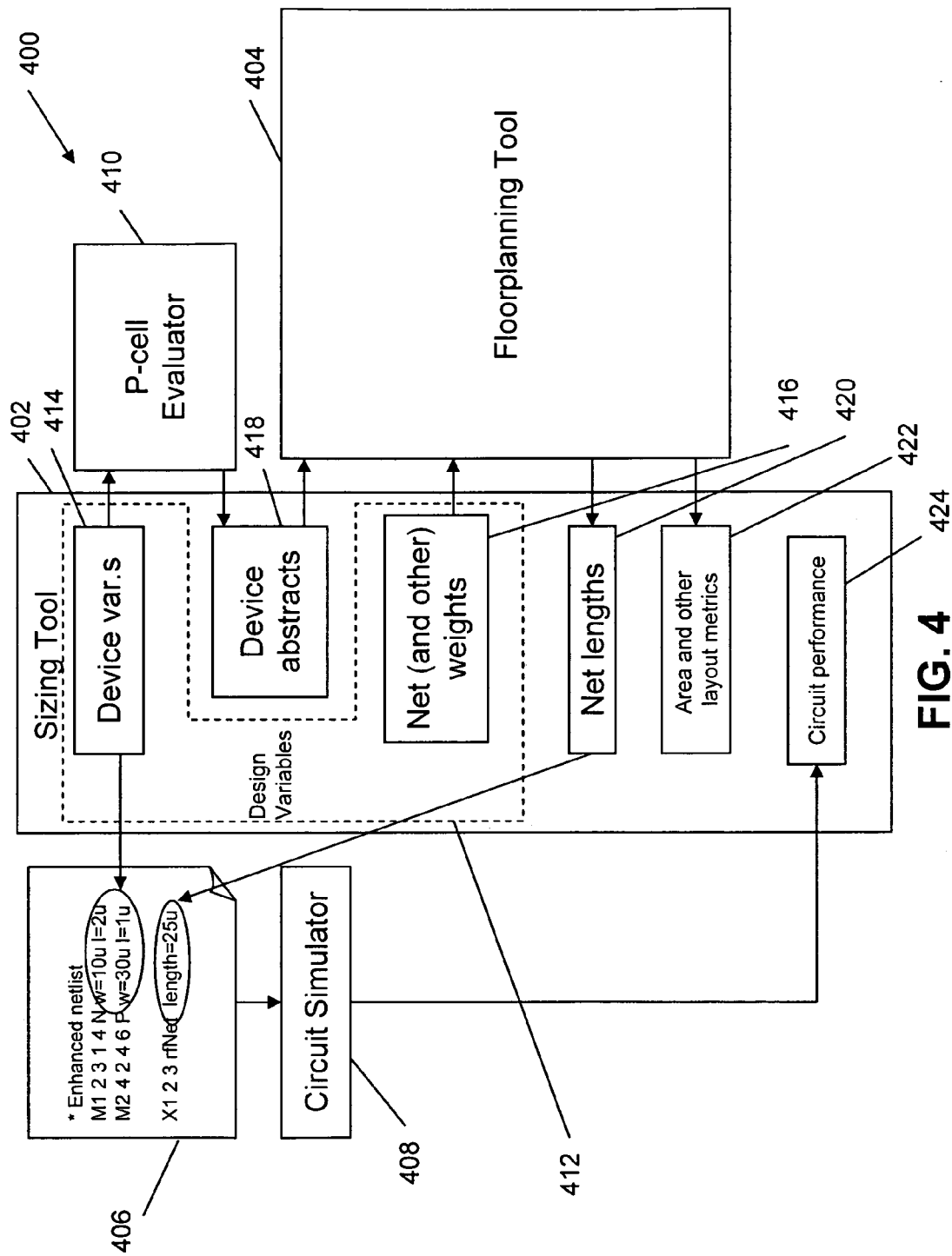
FIG. 4 shows an embodiment of the present invention.

FIG. 4 shows further detail of another integrated sizing and floorplanning module 400 that can be used as the module 202 in FIG. 2. The module 400 includes a sizing tool 402 and a floorplanning tool 404 as shown in FIGS. 2 and 3. Other details include an enhanced netlist 406 (e.g., stored as a file), a circuit simulator 408, and a P-cell evaluator 410. The sizing tool 402 searches for values of design variables 412 (including device variables 414, net weights 416, and possibly other weights) that optimize circuit performance 424 and area metrics 422 (and possibly other layout metrics). The sizing tool 402 also manages intermediate data, including device abstracts 418 and net lengths 420.

The enhanced netlist 406 may be considered as a template for a circuit schematic where the template is parameterized by the device variables 414 and the net lengths 420. For example, in FIG. 4 the enhanced netlist 406 includes a net length value 25 u (i.e., 25 microns) and device variables for width as 10 u and length as 2 u.

Figure 5:
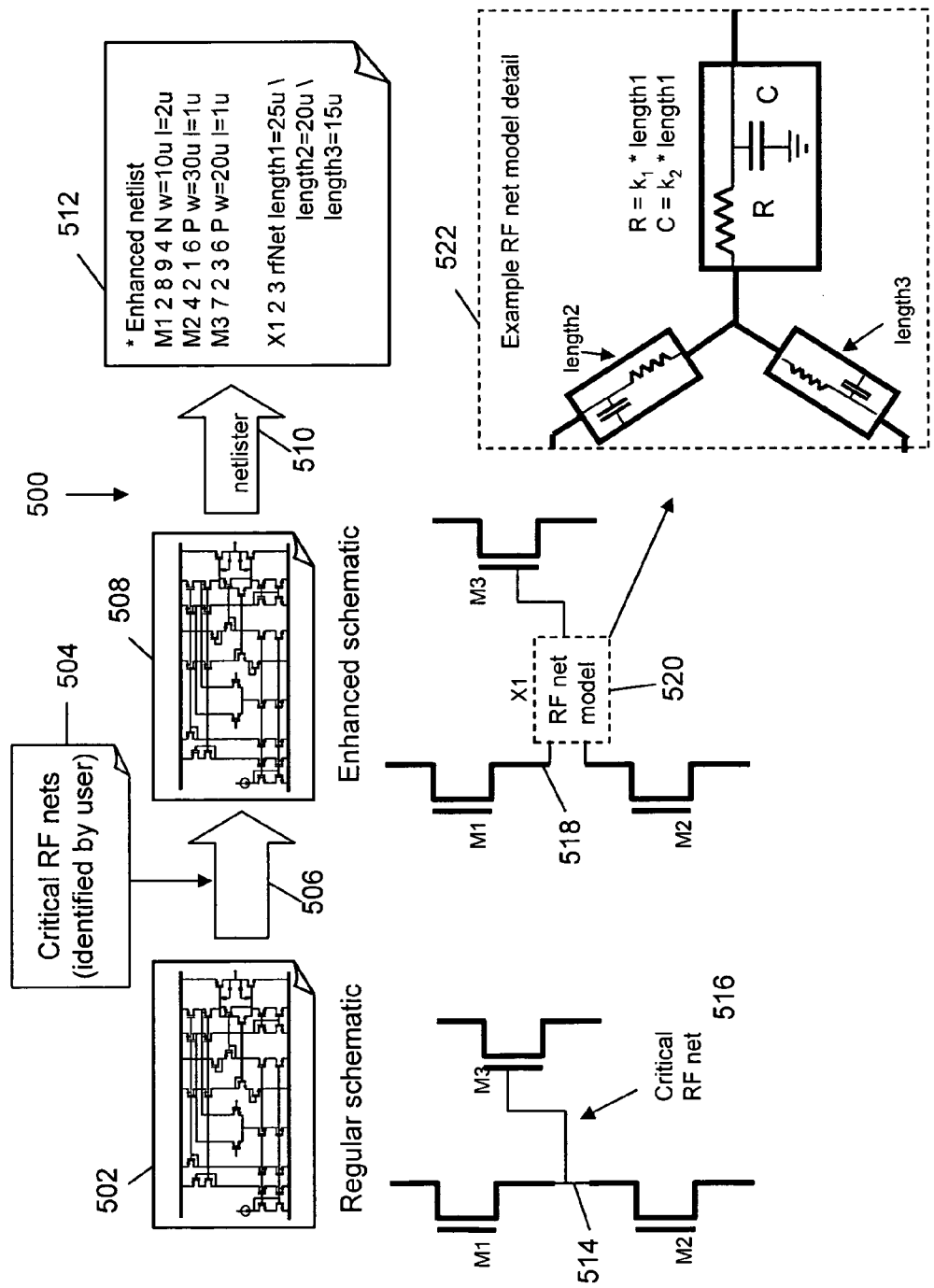
FIG. 5 shows further detail of the embodiment shown in FIG. 4.

FIG. 5 shows a method 500 according to the present invention for generating the enhanced netlist 406. First a regular schematic 502 is assumed to be available. Critical RF nets 504 are identified (e.g., by user input or an automatic process) and these critical RF nets 504 are incorporated 506 into the schematic to give an enhanced schematic 508. Then well-known methods (e.g., "net-lister" methods) can be used to generate the enhanced netlist 512 from the enhanced schematic 508. ("Conversion of circuit schematics from a graphic display to a netlist and its applications", Baez-Lopez, D., Ballesteros, J. L., Pedraza-Chavez, J., 1993, Proceedings of the 36th Midwest Symposium on Circuits and Systems, 16-18 Aug. 1993, pp. 1159-1161, vol. 2.) A detail 514 of the regular schematic 502 is shown with three transistors and a specified critical RF net 516. A corresponding detail 518 of the enhanced schematic 508 is shown with an RF net model 520 in place of the identified critical RF net 516. Additional detail 522 of the RF net model 520 is also shown with standard symbols for the elements (e.g., resistor R and capacitor C parameterized by length parameters). In this way, an enhanced netlist 512 can be generated with sufficient parameterization for the design.

In the regular schematic 502, each net is an ideal short circuit; that is, the potential is the same at each terminal of the net (at all time and for all frequencies). This modeling assumption is often valid when the wires that connect the terminals have no parasitics. However, in the context of RF IC design the effect of parasitics is generally critical to performance.

Automatic generation 506 of the enhanced schematic 508 desirably enhances model fidelity by capturing features not typically modeled by a regular schematic 502 in RF IC design. The regular schematic 502 is generally intended to represent design elements that are under control of the designer and are perceived to contribute positively to the performance of the design. By contrast, parasitic interconnect effects are often detrimental to performance, and their modeling is additionally considered undesirable because it creates "clutter" and reduces the readability of the schematic. From the perspective of many designers these effects are artifacts of the layout and not under the direct control of the designer.

Automatic generation 506 of the enhanced schematic can be further enhanced by a GUI (graphical user interface) in a computer-implemented system so that a user can select candidate critical RF nets 504 based on judgment (or some automated process) and then view corresponding performance estimates or sensitivity estimates (e.g., by calculating differences or variations in the corresponding formulas). Note that the sizing tool 402 can calculate performance estimates or sensitivity estimates through its control of the circuit simulator 408.

A method for automatically generating an enhanced schematic 508 according to the present invention includes: (1) selecting one or more critical RF nets 504, (2) automatically creating a copy of the regular schematic, (3) automatically replacing each critical RF net in the schematic copy with an RF net model 520; and (4) automatically calculating performance estimates or sensitivity estimates based on user input.

As an alternative to automatic insertion 506 of RF net models 520 into the regular schematic 502, manual operations have several disadvantages. Manually maintaining such a schematic would be tedious since such models would have to be inserted or updated each time a new element is added to the schematic or the topology of the circuit is changed. Additionally, it would be difficult to maintain consistency (in terms of naming, correspondence, etc.) with other elements of a manually created enhanced schematic. Further, while it would be easy for a designer to switch from one set of RF net models 520 to another in an automated system (e.g., for comparing performances or estimating sensitivities), an equivalent manual operation is likely to be error prone as well as tedious.

Figure 6:
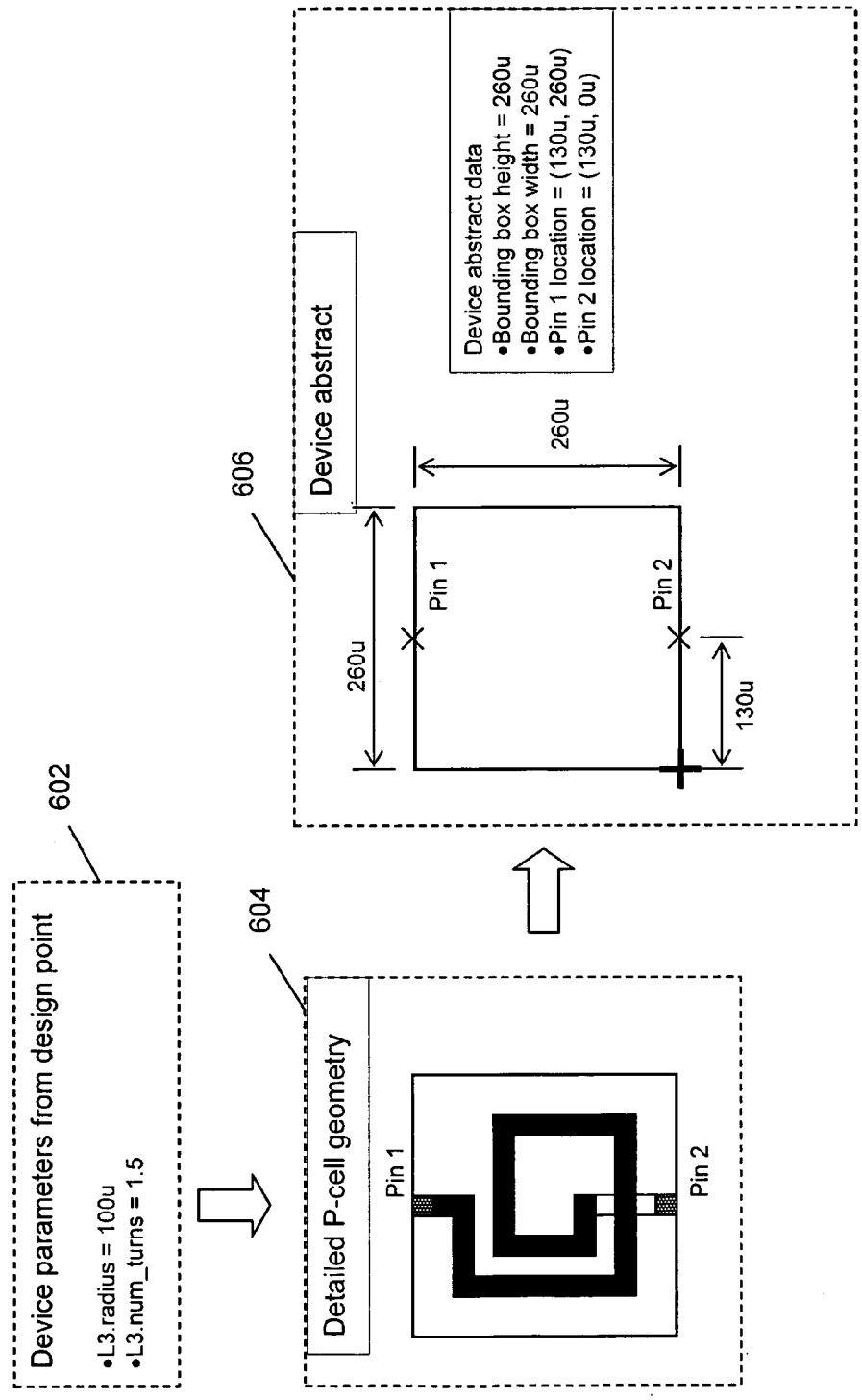
FIG. 6 shows further detail of the embodiment shown in FIG. 4.

The P-cell Evaluator 410 (a particular example of a device generator 306) produces device abstracts 418, which are simplified geometrical device descriptions that are used by the floorplanning tool 404. P-cell technology is well-known to those skilled in the art of IC design. (U.S. Pat. No. 6,449,757) The P-cell Evaluator 410 first calculates the fully-detailed geometry of a device by evaluating its parameterized cell using the device parameters determined by device variables 414. Then, the P-cell Evaluator 410 returns a device abstract 418 that summarizes the detailed geometry. FIG. 6 shows an exemplary device abstract 606 for a spiral inductor. Device parameters from a design point 602 can include, for example, the radius of the spiral and the number of turns. The P-cell evaluator 410 operates on the device parameters 602 to produce the detailed P-cell geometry 604. From the detailed P-cell geometry 604 the P-cell evaluator 410 determines the device abstract 606 including, for example, bounding box height and width, and pin locations (denoted by "X" here and elsewhere). In general, a device abstract 606 contains only a bounding box and pin locations of the corresponding physical device.

Figure 7:
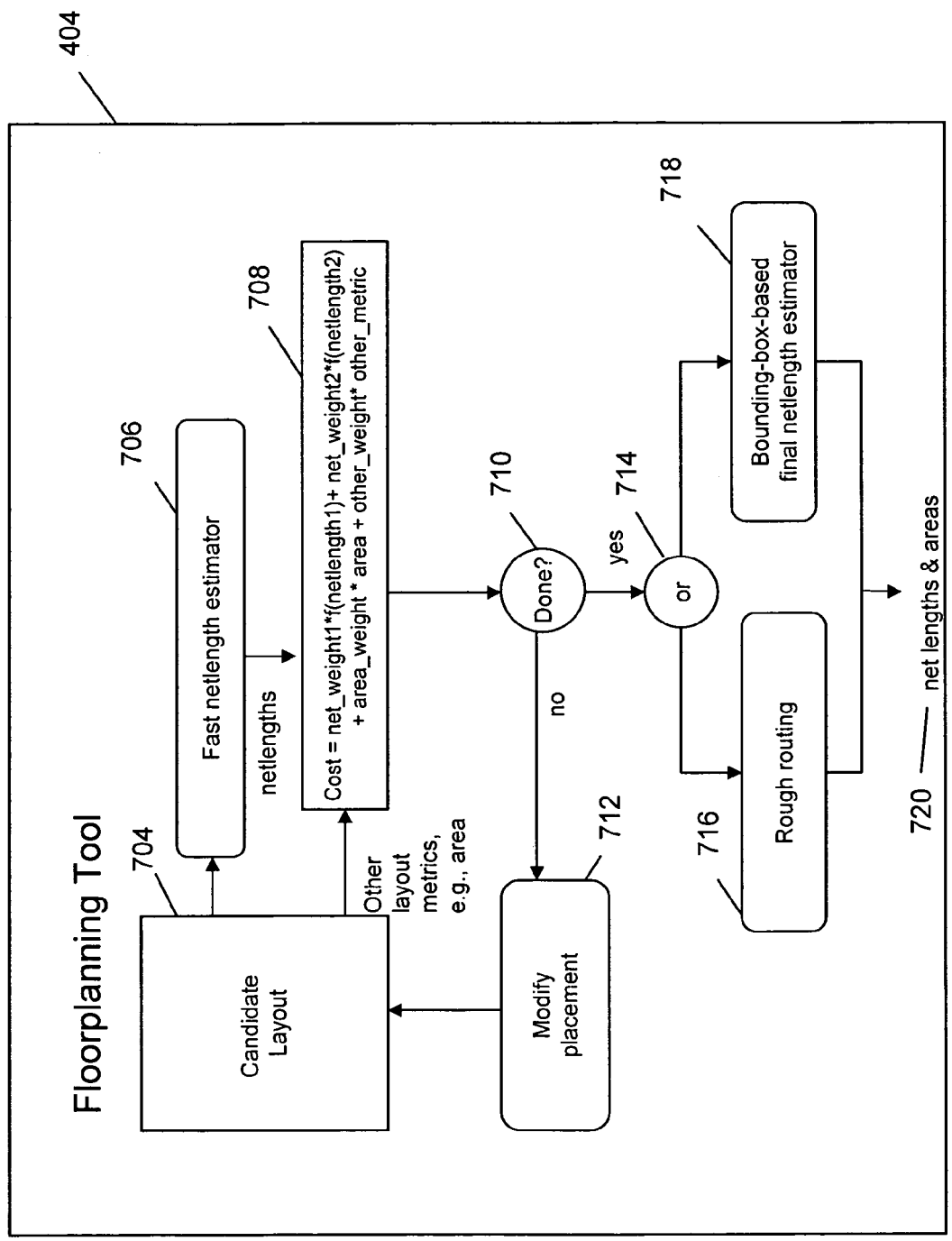
FIG. 7 shows further detail of the embodiment shown in FIG. 4.

FIG. 7 shows further detail of the floorplanning tool 404. From a candidate layout 704, a fast netlength estimator 706 generates net lengths so that the layout can be evaluated by a cost function 708 that in general depends on the net lengths, areas and other layout metrics (e.g., aspect ratios, "soft" constraints such as device proximity, etc.). Additionally the cost function 708 depends on the net weights 416 (and other weights) provided by the sizing tool 402, so that the sizing tool 402 effectively controls (or tunes) the floorplanning tool 404 in its operation.

The floorplanning tool 404 carries out a minimization of the cost function 708 over a number of candidate layouts 704 by some search routine (e.g., gradient search, integer programming, exhaustive search, etc.). When the search is completed 710, the floorplanning tool 404 calculates final net length and area estimates 720 (and possibly other layout metrics). Final netlength estimates may be calculated using several methods; two alternatives 714 include rough routing 716, or a simpler bounding boxed based final netlength estimator 718. Although not shown in FIG. 7, the floorplanning tool 404 generally returns other layout-related values (e.g., positions and orientations of devices) in addition to the net lengths and areas 720.

While the fast netlength estimator 706 must be fast because it is used in the inner loop of the floorplanning tool 404, the strategy for final netlength estimation 716, 718 can be developed with varying complexity according to the relevant operational requirements. For example, in analog IC design, parasitics are typically not a major concern, and so a bounding-box-based final netlength estimator 718 may be sufficient. However, in RF IC design, where parasitic effects are critical, more detailed rough routing 716 may be warranted.

Figure 8:
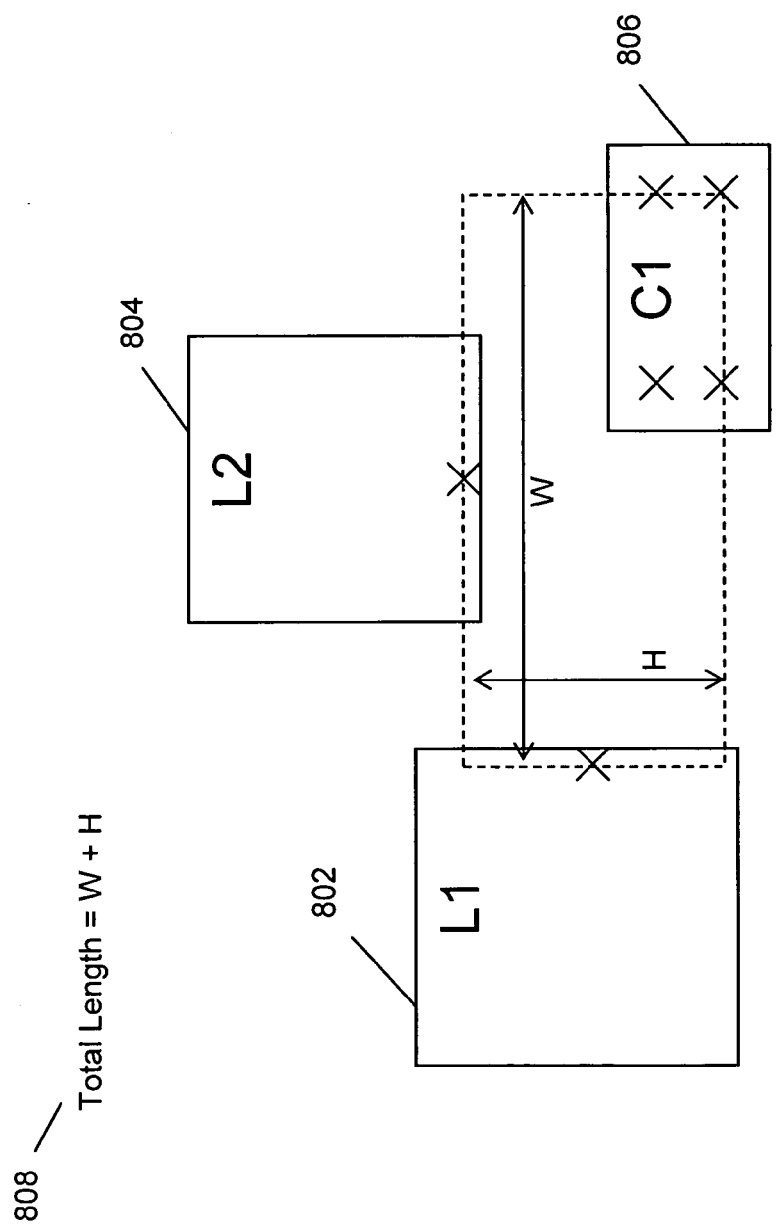
FIG. 8 shows an example related to the embodiment detail shown in FIG. 7.

For example, FIG. 8 illustrates a fast netlength estimator 706 according to an embodiment of the present invention. The example includes two inductors 802, 804 and one capacitor 806, where each pin location is marked by an "X." This estimator gives only the total length of each net, which is the input needed by the floorplanning tool cost function 708. A final netlength estimator similar to FIG. 8 may also be sufficient for some analog applications. For each net, the estimator 706 constructs the bounding box of all pins on that net and returns the bounding box half-perimeter (height+width) as the length estimate 808.

Figure 9:
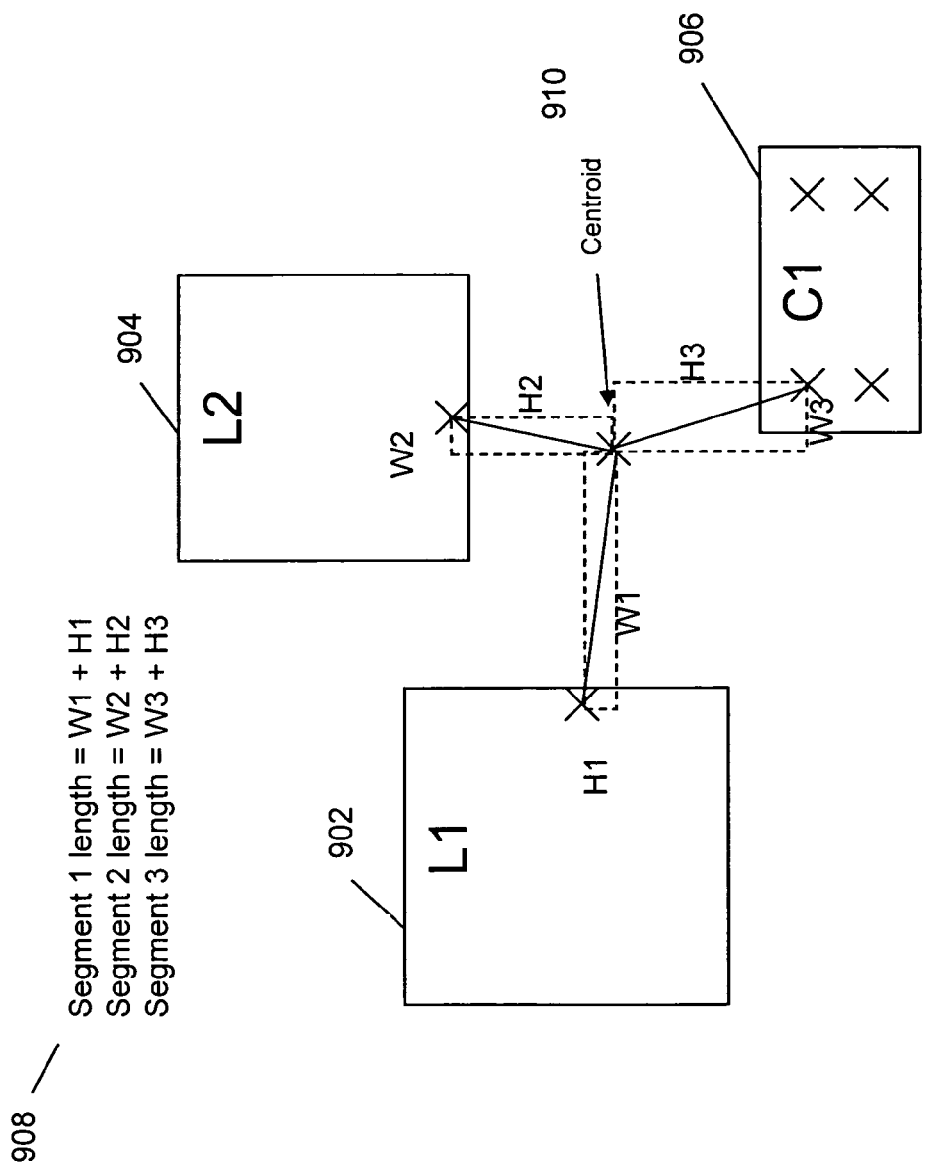
FIG. 9 shows an example related to the embodiment detail shown in FIG. 7.

A somewhat more complex bounding-boxed-based final netlength estimator 718 is shown in FIG. 9. This example similarly includes two inductors 902, 904 and one capacitor 906, where each pin location is marked by an "X.". Three segment lengths 908 are given for total lengths that are combinations of the respective heights (H1, H2, H3) and widths (W1, W2, W3). When several pin choices are available for a device terminal, a method according to the present invention for determining pin choices includes: (1) making initial pin choices; (2) calculating the centroid 910 of the chosen pins; (3) choosing new pins that are closest to the centroid 910; and (4) repeating steps (2) and (3) until the chosen pins do not change up to some upper limit (e.g., three iterations).

More generally, this final netlength estimator 718 calculates n net lengths for an n-terminal net, to provide inputs to an n-terminal RF net simulation model, which had n length parameters. Both the estimator 718 and the simulation models should approximate the true net topology with a star-shaped topology, which has a single center point common to all terminals (i.e., pins). For example, the RF net model 522 shows one possible 3-terminal simulation model that could be used with the 3-terminal net shown in FIG. 9. For connections with multiple available pins, the estimator 718 follows an iterative procedure to find the best pin to minimize the length of that segment. (Note that, in general, terminals are considered as logical connections and pins are considered as corresponding physical connections for the terminals.)

As noted above, a rough router 716 can be used as an alternative to the bounding-box-based final estimator 718 for calculating final net lengths 720. For example, the rough router 716 can generate actual paths between the terminals (i.e., pins) on the devices so that it is aware of complications that the bounding-box estimator 718 might ignore, including net overlaps and device blockages (i.e., devices in the way of the route). Furthermore, the rough router's 716 output could serve as routing "guides" that the user could follow later to route the final layout.

Figure 10:
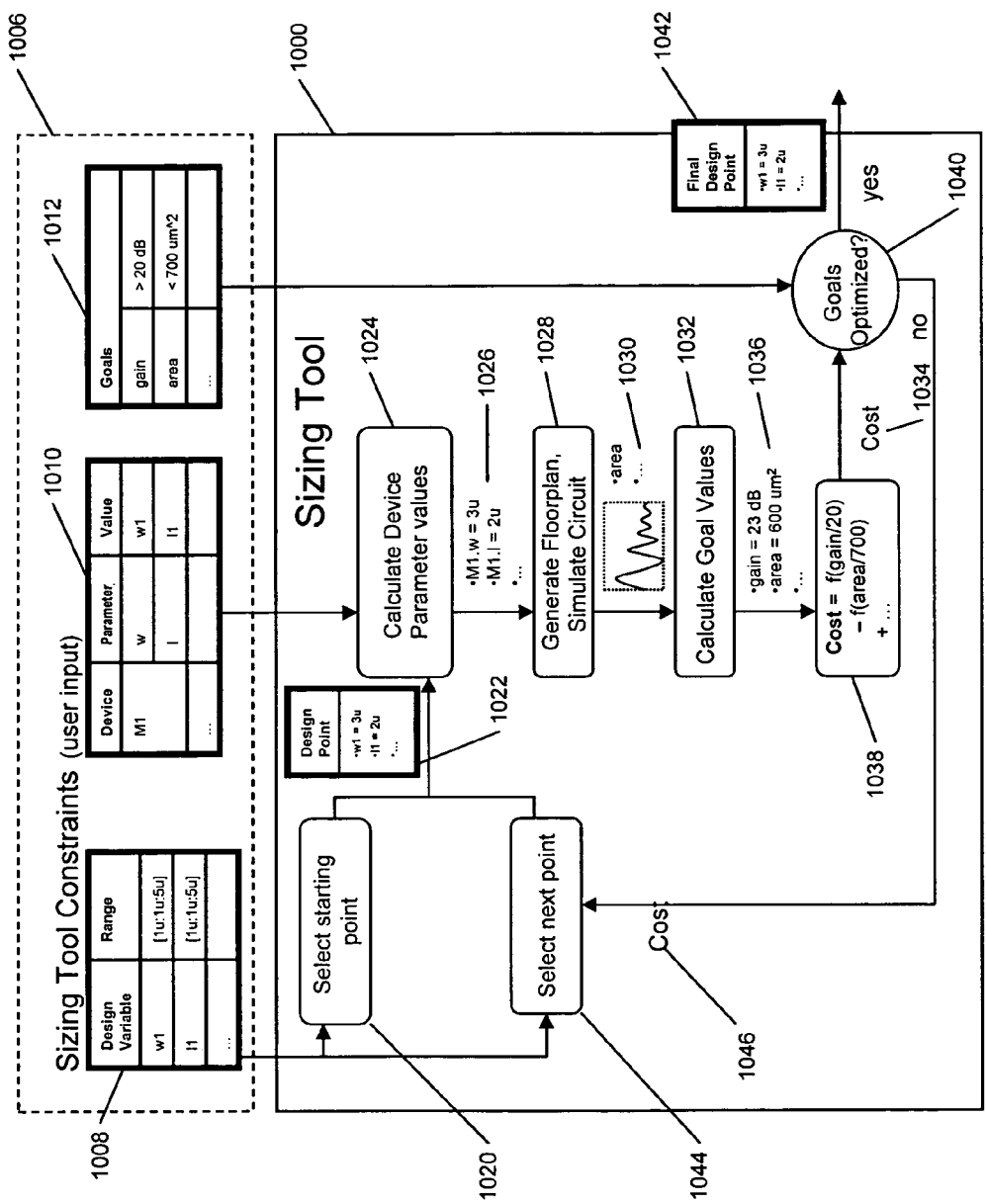
FIG. 10 show further detail of the embodiment shown in FIG. 4.

FIG. 10 shows a more specialized embodiment of the sizing tool 402 in its operations for optimizing circuit performance 424 over choices for design variables 412. As shown in FIG. 10, the sizing tool 1000 implements a global optimization algorithm that searches the space of design variables 1008 to find a final design point 1042 that satisfies all goals 1012 and has an optimally low cost, as measured by cost function 1038. Many global optimization algorithms have been applied successfully to the circuit sizing problem. For explanatory purposes, the description of the sizing tool 1000 will be specialized to simulated annealing, a global optimization method well-known to those skilled in the art of IC design. ("Optimization by Simulated Annealing", Kirkpatrick, S., C. D. Gelatt Jr., and M. P. Vecchi, *Science*, Volume 220, Number 4598, 1983, pp. 671-680.)

Before the sizing tool 1000 can run, the user must first set up sizing tool constraints 1006 for the circuit being sized, including design variables 1008, device parameter constraints 1010, and goals 1012.

The optimization method begins by selecting a starting point 1020. True global optimization algorithms like simulated annealing are insensitive to the choice of starting point, so the design variable 1008 values for the starting point may be chosen randomly from their defined ranges. The resulting set of design variable values is known as a design point 1022. Next, using the design point 1022 values and the device parameter constraints 1010, the sizing tool calculates 1024 device parameter values 1026.

Given the design point 1022 and its corresponding device variable values 1026, the sizing tool 1000 proceeds to generate a floorplan and simulate the circuit 1028. During this step 1028, the sizing tool 1000 manages interactions with several external processes, including the P-cell evaluator 410, the floorplanning tool 404, and the circuit simulator 408 as shown in FIG. 4. The outputs received from the external processes include simulation outputs and layout metrics 1030. The sizing tool 1000 can then calculate goal values 1036 for the design point 1022. In general, the goal values may be calculated from arbitrary user-defined functions.

From the goal values 1036, the sizing tool evaluates the cost function 1038. One simple and effective cost function uses a linear combination of goal values 1036, normalized by the goal target values from the goal constraints 1012. Many cost function refinements are also possible, including transforming the normalized goal values with a monotonic function, and allowing user-defined goal weights.

Given a set of goal values 1036 and a cost 1034, the sizing tool 1000 decides whether the design point 1022 is a satisfactory solution 1040 (i.e., whether the goals 1012 have been optimized). The solution must at least satisfy all goals 1012. The sizing algorithm may also attempt to optimize the goal values 1036 beyond the target values specified in the goal constraints 1012, by minimizing the design point cost 1034. In this case, once the goals 1012 have been met 1040, an effort-based termination criterion is usually applied. For example, the optimization method may terminate if the cost 1034 has not improved in the last fifty iterations. When the method terminates 1040, it reports its final design point 1042.

If the method does not terminate 1040 according to the nominal criteria discussed above, a new design point can be selected 1044 for evaluation. A simulated annealing method then selects its next point in two steps. First, it decides whether to accept the most-recently-evaluated point as its new internal state. The decision is probabilistic and depends on the point's cost 1046 and a fictional "temperature", which decreases with time according to a "cooling schedule". If the cost 1046 is lower than the old internal state, the point is always accepted; if the cost 1046 is higher, the point is accepted with a non-zero probability that increases with temperature and decreases with the cost differential. Next, after updating its internal state, the method copies the internal state and randomly perturbs one or more design variables 1008 in the copy to generate a new design point 1022.

Eventually the sizing tool 1000 terminates according to some criterion (e.g., goal optimization 1040 or an iteration threshold) and returns a final design point 1042. As noted above, the discussion of this sizing tool 1000 has been specialized to a simulated annealing method for optimizing design variables 1008, but other methods known to those skilled in the art of IC design are also possible. (R. Phelps, M. Krasnicki, R. A. Rutenbar, L. R. Carley, J. R. Hellums, "ANACONDA: Robust Synthesis of Analog Circuits Via Stochastic Pattern Search," *Proc. IEEE Custom Integrated Circuits Conference*, May 1999.)

As discussed above, many of the processes of the integrated sizing and floorplanning module 400 are controlled by the sizing tool 402, which iteratively manipulates design variables 412 in order to optimize circuit performance 424 and layout metrics 422 (e.g., area metrics). The sizing tool 402 utilizes at least two kinds of design variables 412: device variables 414 and net weights 416. Device variables 414 are used to determine the parameters of devices in the circuit (e.g., transistor width and length). Net weights 416 are used to control the floorplanning tool 404 by altering its internal cost function 708. When the sizing tool 402 increases the weight of a net 416, the floorplanning tool 404 will produce a layout (including net lengths 420 and areas 422) where that net is correspondingly shorter. Although the two types of design variables 412 are used for different purposes, the optimization routine in the sizing tool 402 typically manipulates them in the same way.

During its optimization process, the sizing tool 402 repeatedly chooses an assignment for the design variables 412 (e.g., the design point 1022 shown in FIG. 10) and evaluates the resulting design (e.g., calculating goal values 1032 in FIG. 10). A method for evaluating a design point according to the present invention is now described.

First, the sizing tool 402 selects values for the design variables 412 (i.e., device variables 414 and net weights 416). (As discussed above with reference to FIG. 10, the initial values 1020 can be taken as random for the first cycle of the method when no additional information is available.)

Next, for each device in the circuit, the sizing tool 402 passes the corresponding device parameter values (e.g., from the device variables 414) to the P-cell evaluator 410, which calculates the physical device geometry and returns a corresponding device abstract 418 (e.g., as in the device abstract 606 of FIG. 6). (This step may be considered as an aspect of generating the floorplan and simulating the circuit 1028 in the embodiment shown in FIG. 10.)

Next, the sizing tool 402 passes device abstracts 418 and net weights 416 to the floorplanning tool 404. The floorplanning tool 404 searches through multiple (e.g., thousands) of alternative placements of the device abstracts 418. Net lengths are estimated 706 for each candidate layout 704 and the corresponding cost 708 is minimized in order to return a minimum cost layout 720. Here the dependence of the cost 708 on the net weights 416 enables the sizing tool to control the floorplanning tool 404. (This step may be considered as an aspect of generating the floorplan and simulating the circuit 1028 in the embodiment shown in FIG. 10.)

Next, the floorplanning tool 404 returns net lengths 420 and layout metrics 422 to the sizing tool 402. The net lengths 420 may be measured by a bounding-box-based estimator 718 or a more realistic rough router 716. The rough router 716 typically generates routing "guides" that the user can follow later to complete the final routing. (This step may be considered as an aspect of generating the floorplan and simulating the circuit 1028 in the embodiment shown in FIG. 10.)

Next the sizing tool 402 passes device variables 414 (i.e., device parameter values) and net lengths 420 to the enhanced netlist 406, which is then passed to the circuit simulator 408. The simulator 408 simulates the enhanced netlist 408, which includes RF net parasitic models that are parameterized on length. Circuit simulator technology is well-known to those skilled in the art of IC design. ("Computer analysis of nonlinear circuits, excluding radiation (CANCER)", Nagel, L. and Rohrer, R., *IEEE Journal of Solid-State Circuits*, Volume: 6, Issue 4, Aug. 1971, pp. 166-182.) (This step may be considered as an aspect of generating the floorplan and simulating the circuit 1028 in the embodiment shown in FIG. 10.)

Next the sizing tool 402 uses the results of the simulation 408 to calculate a circuit performance metric 424. (This step may be considered as an aspect of calculating goal values 1032 in the embodiment shown in FIG. 10.)

Finally, the sizing tool 402 evaluates the circuit performance metric 424 and the layout metric (or multiple metrics) 422 against performance standards to determine if the process should terminate or continue. (This step may be considered as an aspect of determining the cost 1038 and determining if the cost/goals have been optimized 1040 in the embodiment shown in FIG. 10.)

Figure 11A:
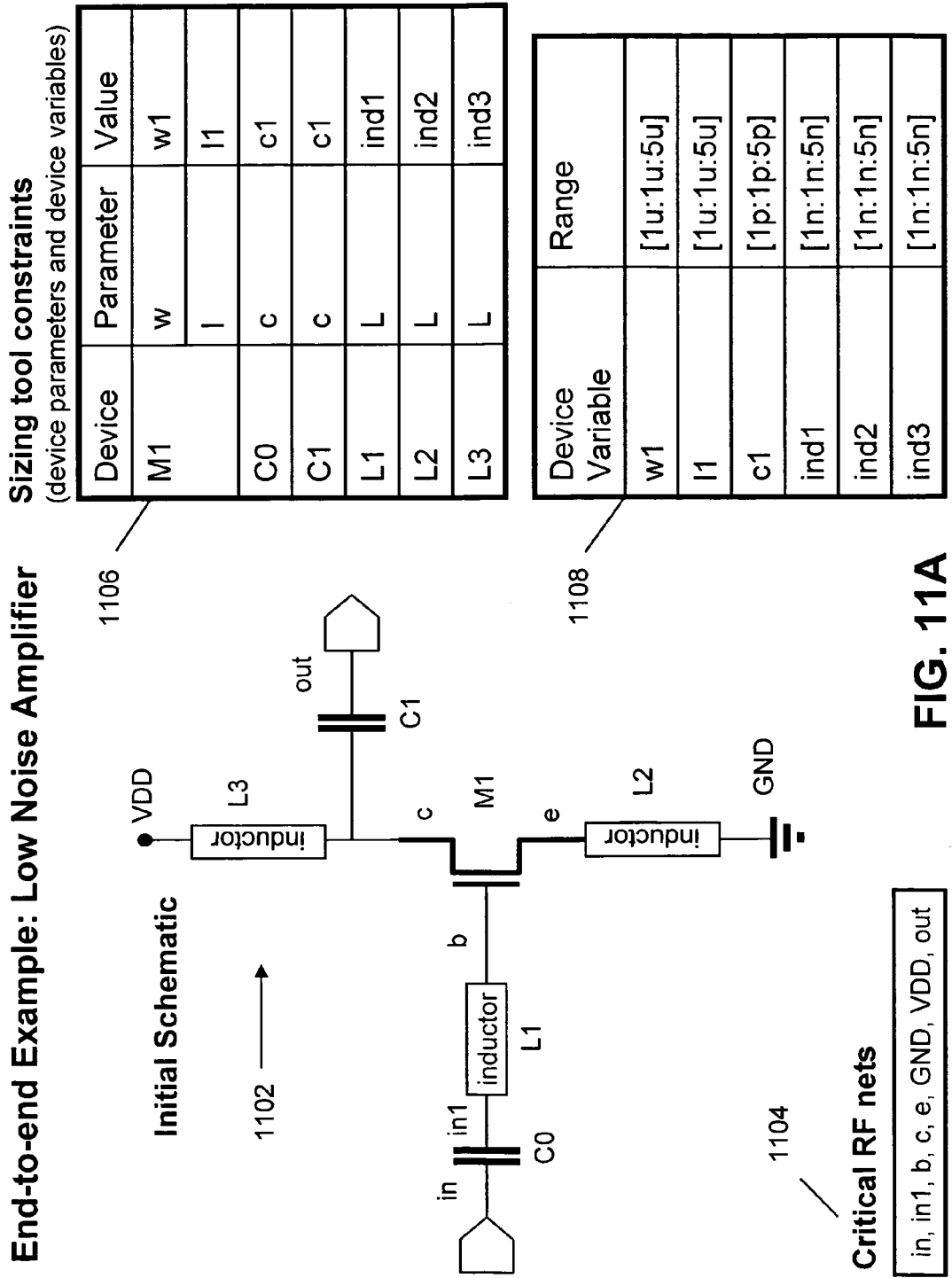

FIGS. 11A-11E show an embodiment of the present invention for integrated sizing and floorplanning 400 as applied to an LNA (Low Noise Amplifier). FIG. 11A shows an initial schematic 1102 including well-known schematic symbols (e.g., inductor L1). Critical RF nets 1104 are identified (e.g., as in FIG. 5). The illustrated sizing tool constraints include device parameters 1106 and device variables 1108. For example, from the device parameter table 1106, device L1 (an inductor) includes a parameter L (inductance) that takes on possible values given by a range ind1. From the device variable table 1108, the range ind1 is specified as [1 n:1 n:5 n] (i.e., a vector from 1 nanohenry to 5 nanohenries in increments of 1 nanohenry). In this way the device variables 1108 specify values (e.g., as a range or a discrete set) for the device parameters 1106 of a device model.

FIG. 11B shows a complete list of design variables including device variables 1110 and net weights 1112. For example, ind1 is listed as a design variable 1110.

Figure 11C:
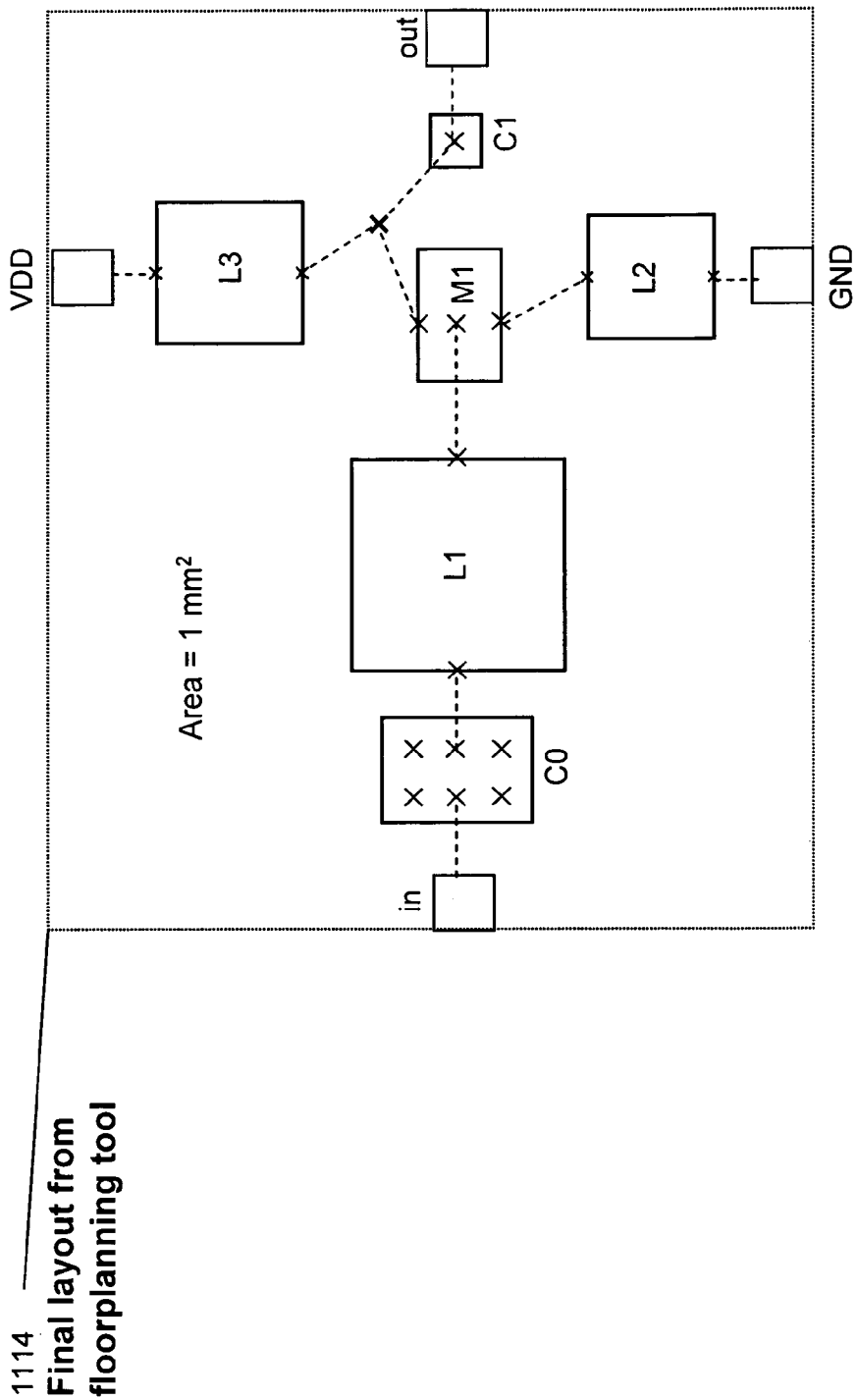

FIG. 11C shows a final layout 1114 from the floorplanning tool 404, where the element symbols (e.g. L1) correspond to the elements in FIG. 11A. The area is represented as 1 mm$^2$. The layout 1114 includes a specification for the position and orientation of each device and also includes the corresponding net lengths, which are shown with dotted lines in the layout 1114. An "X" is shown in the layout 1114 for each pin location.

FIG. 11D shows the results 1116 for an embodiment of the integrated sizing and floorplanning module 400 for four iterations. Design variables and performance metrics are shown.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method for determining an IC (integrated circuit) design, comprising:
    determining one or more design variables, wherein the one or more design variables include one or more device variables and one or more weights;
    determining one or more net lengths and one or more layout metrics from the one or more device variables and the one or more weights; and
    determining the IC design from the one or more device variables and the one or more net lengths, the IC design including a schematic and a layout.

2. A method according to claim 1, wherein determining the one or more net lengths and the one or more layout metrics includes:
    determining one or more device abstracts from the one or more device variables, wherein each device abstract includes a bounding box and at least one pin location for characterizing a corresponding device; and
    determining the one or more net lengths and the one or more layout metrics from the one or more device abstracts and the one or more weights.

3. A method according to claim 1, further comprising:
    determining one or more performance values for the IC design from the one or more device variables and the one or more net lengths.

4. A method according to claim 1, further comprising:
    determining one or more performance values for the IC design from the one or more device variables and the one or more net lengths, the one or more performance values including one or more circuit performance metrics.

5. A method according to claim 1, further comprising:
determining one or more performance values for the IC design from the one or more device variables and the one or more net lengths, the one or more performance values including one or more layout performance metrics.

6. A method according to claim 1, wherein
determining the one or more net lengths and the one or more layout metrics includes determining one or more positions and orientations for one or more devices; and
the layout includes the one or more net lengths and the one or more positions and orientations of the one or more devices.

7. A method according to claim 1, wherein
determining the IC design includes determining one or more device parameters for one or more devices from the one or more design variables; and
the schematic includes an unsized schematic and the one or more device parameters for the one or more devices.

8. A method according to claim 1, further comprising:
determining one or more performance values for the IC design from the one or more device variables and the one or more net lengths;
determining if the one or more performance values satisfy one or more performance criteria; and
if the one or more performance values do not satisfy one of the one or more performance criteria, determining a second IC design, wherein determining the second IC design includes:
determining one or more second design variables, wherein the one or more second design variables include one or more second device variables and one or more second weights;
determining one or more second net lengths and one or more second layout metrics from the one or more second device variables and the one or more second weights; and
determining the second IC design from the one or more second device variables and the one or more second net lengths, the second IC design including a second schematic and a second layout.

9. A method according to claim 1, further comprising:
calculating values for the one or more design variables by improving one or more circuit performance metrics for fixed values of the one or more net lengths; and
calculating values for the one or more net lengths by improving the one or more layout metrics for fixed values of the one or more design variables.

10. A method according to claim 1, further comprising:
calculating one or more performance values for the IC design from the one or more device variables and the one or more net lengths; and
adjusting the weights to change the net lengths for improving the one or more performance values.

11. A method according to claim 1, further comprising:
determining an enhanced netlist for the IC design from the one or more device variables and the one or more net lengths, wherein at least one net in an RF (Radio Frequency) signal path is characterized by an RF net for modeling electrical performance; and
calculating one or more performance values from the enhanced netlist.

12. A method according to claim 11, wherein the RF net includes:
a plurality of segments that connect from a center point to pin locations of devices related to the RF net, and
at least one parameter for resistance, capacitance or inductance.

13. An apparatus for integrated sizing and floorplanning, comprising;
a sizing tool for determining one or more design variables, the one or more design variables including one or more device variables and one or more weights; and
a floorplanning tool for determining one or more net lengths and one or more layout metrics from the one or more device variables and the one or more weights, the floorplanning tool being connected to the sizing tool, wherein
the sizing tool determines the IC design from the one or more device variables and the one or more net lengths, and
the IC design includes a schematic and a layout.

14. An apparatus according to claim 13, further comprising a device generator that receives at least some of the one or more device variables from the sizing tool and provides one or more device abstracts to the sizing tool, wherein
each device abstract includes a bounding box and at least one pin location for characterizing a corresponding device, and
the floorplanning tool receives the one or more device abstracts and the one or more net weights from the sizing tool and provides the one or more net weights and the one or more layout metrics to the sizing tool.

15. An apparatus according to claim 14, wherein the device generator includes a P-cell evaluator for generating the one or more device abstracts.

16. An apparatus according to claim 13, wherein the sizing tool determines one or more performance values for the IC design from the one or more device variables and the one or more net lengths.

17. An apparatus according to claim 13, wherein the sizing tool determines one or more circuit performance values for the IC design from the one or more device variables and the one or more net lengths.

18. An apparatus according to claim 13, wherein the sizing tool determines one or more layout performance values for the IC design from the one or more device variables and the one or more net lengths.

19. An apparatus according to claim 13, wherein
the floorplanning tool determines one or more positions and orientations for one or more devices, and
the layout includes the one or more net lengths and the one or more positions and orientations of the one or more devices.

20. An apparatus according to claim 13, wherein
the sizing tool determines one or more device parameters for one or more devices from the one or more design variables, and
the schematic includes an unsized schematic and the one or more device parameters.

21. An apparatus according to claim 13, wherein
the sizing tool determines one or more performance values for the IC design from the one or more device variables and the one or more net lengths,
the sizing tool determines if the one or more performance values satisfy one or more performance criteria, and
if the one or more performance values do not satisfy one of the one or more performance criteria, the sizing tool determines a second IC design, the second IC design including a second schematic and a second layout.

22. An apparatus according to claim 21, wherein the sizing tool determines one or more second design variables, the one or more second design variables including one or more second device variables and one or more second weights, the sizing tool determines one or more second net lengths and one or more second layout metrics from the one or more second device variables and the one or more second weights, and the sizing tool determines the second IC design from the one or more second device variables and the one or more second net lengths.

* * * * *